United States Patent
Irie et al.

(10) Patent No.: US 7,116,949 B2
(45) Date of Patent: Oct. 3, 2006

(54) SEMICONDUCTOR INTEGRATED CIRCUIT DEVICE AND WIRELESS COMMUNICATION SYSTEM

(75) Inventors: Kiyoshi Irie, Yabe (JP); Kazuaki Hori, Hirado (JP); Kazuhiko Hikasa, Hamura (JP)

(73) Assignee: Renesas Technology Corp., Tokyo (JP)

( * ) Notice: Subject to any disclaimer, the term of this patent is extended or adjusted under 35 U.S.C. 154(b) by 526 days.

(21) Appl. No.: 10/685,481

(22) Filed: Oct. 16, 2003

(65) Prior Publication Data
US 2004/0092236 A1 May 13, 2004

(30) Foreign Application Priority Data
Nov. 8, 2002 (JP) ............... 2002-324813

(51) Int. Cl.
 *H01Q 11/12* (2006.01)
 *H03F 3/45* (2006.01)
 *H04L 25/49* (2006.01)
 *H04B 1/38* (2006.01)

(52) U.S. Cl. ............ 455/118; 455/73; 455/127.3; 330/254; 375/297

(58) Field of Classification Search ............ 455/118, 455/73, 127.1, 127.2, 127.3, 241.1, 245.2, 455/522; 330/254, 278, 127, 124 R, 123, 330/133; 375/297, 312
See application file for complete search history.

(56) References Cited

U.S. PATENT DOCUMENTS 6,127,890 A * 10/2000 Shimomura et al. ........ 330/254
6,215,987 B1 * 4/2001 Fujita ..................... 455/127.3
6,650,691 B1 * 11/2003 Cramer, III ................ 455/522
6,675,000 B1 * 1/2004 Ichikawa ................. 455/127.3
2004/0071225 A1 * 4/2004 Suzuki et al. ............... 375/297

FOREIGN PATENT DOCUMENTS

| EP | 1-011207 | 6/2000 |
|---|---|---|
| JP | 9-270733 | 10/1997 |
| JP | 2000-216726 | 8/2000 |
| WO | 00/55968 | 9/2000 |

* cited by examiner

*Primary Examiner*—Aung Moe
(74) *Attorney, Agent, or Firm*—Mattingly, Stanger, Malur & Brundidge, P.C.

(57) ABSTRACT

The dynamic range is changed by switching a current applied to an amplifying circuit to obtain the minimum ICP required to keep linearity with the number of multiplexes even when the number of multiplexes of data is changed by switching the operation current of the amplifying circuits of the transmission system and also supplying the information about number of multiplexes of data to be transmitted to the amplifying circuits of the transmission system from the baseband circuit. Thereby, the signal can be transmitted without distortion even when the number of multiplexes increases and the current of the amplifying circuit may be reduced when the number of multiplexes is small in order to reduce the current consumption in the communication semiconductor integrated circuit device which can form a wireless communication system of the code division multiplex system such as W-CDMA system.

13 Claims, 14 Drawing Sheets

SEMICONDUCTOR INTEGRATED CIRCUIT DEVICE AND WIRELESS COMMUNICATION SYSTEM

BACKGROUND OF THE INVENTION

The present invention relates to a wireless communication technology, more specifically to a technology which may be effectively applied, while increase of power consumption is controlled, for improving linearity of a semiconductor integrated circuit device comprising an amplifying circuit to amplify the code division multiplexed transmitting signal. Moreover, the present invention relates to a technology which may be effectively applied to a semiconductor integrated circuit device for communication constituting a wireless communication device, for example, of W-CDMA (Wideband Code Division Multiple Access) system and to a wireless communication device such as a mobile telephone or the like comprising the same semiconductor integrated circuit device.

In the wireless communication device such as a mobile telephone (mobile communication device), a multiplex system is employed to increase the amount of data to be transmitted. The present multiplex system used for the mobile telephone includes a TDMA system (time division multiplex system) and a CDMA system (code division multiplex system) or the like. The CDMA system is a communication system where a plurality of diffused codes having orthogonality in the same frequency space are used for spectrum diffusion of carrier and the diffused carriers are assigned to a plurality of channels. The CDMA system is employed for the mobile telephone of the W-CDMA system. In the mobile telephone of the PDC (Personal Digital Cellular) system and GSM (Global System for Mobile Communication) system, the TDMA system is employed.

In the mobile telephone of W-CDMA system, the I, Q signals generated based on the transmission data in a baseband circuit are supplied to a transmitting circuit including a modulation circuit, the signals obtained by modulating a local oscillation signal with the I, Q signals are supplied to a power amplifier for the power amplification and finally the amplified signals are outputted from an antenna. For the mobile telephone of the W-CDMA system, there is provided a system where level and accuracy of an average output power corresponding to the output request level transmitted from a base station are determined by the specification, gain of a power amplifier is controlled with an output control signal supplied from the baseband circuit, and signals are transmitted in the specified output power.

SUMMARY OF THE INVENTION

In the specification of the mobile telephone of the W-CDMA system, it is specified that the data of six channels in maximum can be transmitted from one channel through the multiplexing, but this method has problems that the more the number of multiplexes of data is increased, the more the distortion of transmission signal increases and thereby the ACPR (leak power ratio to the adjacent channel) characteristic is deteriorated. Therefore, the inventors of the present invention have investigated causes of these problems. As a result of the investigation, it has become apparent that the number of multiplexes of data is closely related to peak factor and the peak factor becomes larger as the number of multiplexes increases. Here, the peak factor is a difference between the maximum peak value or the transmission signal (momentary maximum power) and an average output level.

FIGS. 13(A) and 13(B) illustrate waveform images of the transmission signals when the number of multiplexes is "1" and "6" in the W-CDMA system. In these FIGS. 13(A) and 13(B), "ave" is an average output level which is determined with an output control voltage. In the specification of the mobile telephone of the W-CDMA system, even when the average output level ave is identical as illustrated in FIGS. 13(A) and 13(B), the peak factor when the number of multiplexes is "6" becomes larger than that when the number of multiplexes is "1". FIG. 14 illustrates the relationship between the number of multiplexes and peak factor in the mobile telephone of the W-CDMA system. From FIG. 14, the peak factor is about 3 dB when the number of multiplexes is "1", but it increases up to 7.5 dB when the number of multiplexes is "6".

Moreover, it has been found when the transmission signal is amplified with an amplifying circuit having a narrower dynamic range with the peak factor which is large as described above, distortion of signal increases and the ACPR characteristic is deteriorated. Therefore, the inventors of the present invention have thought to design an amplifying circuit having wider dynamic range to amplify the transmission signal in order to obtain the IPC (1 dB Compression Point) for transmission of signal without distortion even when the maximum number of multiplexes is "6".

It is generally known that a wide dynamic range of the amplifying circuit can be obtained by increasing a current flowing into the circuit. However, since power consumption of the total system increases when the current of the amplifying circuit increases, it is a problem to be eliminated as much as possible in the system such as a mobile telephone which is operated with a battery. Particularly, since the transmitting operation is executed separately from the receiving operation in the mobile telephone of the time division multiplex system like a PDC, the current consumption is not so large. However, in the mobile telephone of the W-CDMA system, since the transmitting operation and receiving operation are executed simultaneously and continuously, current consumption is considerably larger than that of the mobile telephone of the PDC system. Therefore, increase in current of the amplifying circuit in the mobile telephone of the W-CDMA system will result in the problem that the maximum communication time and the maximum waiting time which are intrinsically short may be further shortened.

As the prior art of the present invention, there is the Japanese Published Unexamined Patent Application No. 270733/1997. This prior art is intended to realize low power consumption by changing accuracy of arithmetic operations of a band-pass filter depending on the information about number of channels to be multiplexed. Therefore this prior art seems to be similar to the present invention when attention is paid to reduction of power consumption by switching the circuits based on the information about the number of multiplexes of the signals.

However, the present invention relates to a mobile telephone but this prior art relates to a transmitter in the base station side. Moreover, in the present invention, the information used for control is the number of multiplexes of data to be transmitted, while such data is the number of multiplexes of channel, namely the number of mobile terminals for communication in the prior art. In addition, the control object circuit to be switched is the dynamic range of a differential amplifier (analog circuit) in the present invention but it is the number of taps in the band-pass filter (digital filter) in the prior art. Therefore, the prior art is the invention which is obviously different from the present invention.

An object of the present invention is to realize, in a wireless communication system which performs multiplexing of signals with spectrum diffusion such as a W-CDMA system, that a signal can be transmitted without distortion even when the number of multiplexes is increased and a current of an amplifying circuit can be reduced to result in lower current consumption when the number of multiplexes is small and thereby the operation life of a battery, namely the maximum communication time and the maximum waiting time based on the single charging cycle can be extended considerably when the present invention is applied to a mobile telephone.

Another object of the present invention is to provide a semiconductor integrated circuit device for communication to form a wireless communication system of the code division multiplex system which can improve the ACPR (leak power ratio to the adjacent channel) characteristic, and to provide a wireless communication system using the same semiconductor integrated circuit device.

The aforementioned and the other objects and novel features of the present invention will become apparent from description of the present specification and the accompanying drawings.

First, a problem in the transmission system of the mobile telephone of the W-CDMA system to which the attention of the inventors has been paid and a method of solving the problem of the present invention will be described.

In the W-CDMA transmission system, the signals (sin wave and cos wave) of the predetermined frequency in the phases with difference of 90° are subjected to the BPSK modulation with the control data DPCCH and user data DPDCH to generate I and Q signals, and these signals are diffused in the spectrum with the channelization code in the rate of 3.84 Mcps. When the user data DPDCH is "0", the I signal modulated only with the control data DPCCH is generated and this signal is spectrum-diffused. When the user data DPDCH is "3", the control data DPCCH and one of the user data, for example, DPDCH2 are assigned to the Q signal. Moreover, the remaining two data DPDCH1, DPDCH3 of the user data are assigned to the Q signal for modulation. Thereafter, the signal is spectrum-diffused. Generation of the I signal and Q signal, namely multiplex described above is performed in the circuit called the baseband circuit.

FIGS. 12(A) and 12(B) illustrate constellations indicating, on the IQ coordinates, position and changing direction of each symbol of the signal generated by the code division diffusing process (multiplex) performed by the baseband circuit. FIG. 12(A) corresponds to the constellation when the number of multiplexes is "1", while FIG. 12(B) corresponds to the constellation when the number of multiplexes is "6". From these figures, it is obvious that the probability for passing the origin when the number of multiplexes is "1" is higher than that when the number of multiplexes is "6". Here, since the fact that a symbol shifts to the other symbol passing the origin means that the phase changes for 180°, amount of protrusion to the external side from the position of the target symbol becomes larger than that of the other case. Increase in amount of protrusion is a cause of enlargement of the peak factor of the transmission signal as illustrated in FIGS. 13(A) and 13(B).

In the W-CDMA system, diffusion is executed twice as specified in the specification, but the HPSK modulation is performed when the second diffusion is executed. Accordingly, probability for passing the origin in the IQ constellation may be reduced, the peak factor may be kept small and the linearity required for transmitting circuit may also be alleviated. However, when the number of multiplexes, namely the number of user data DPDCH increases, effect of the HPSK modulation is lowered. Therefore, it is thought that probability for passing the origin in the constellation increases and thereby the peak factor is increased.

FIG. 14 illustrates the relationship between the number of multiplexes and the peak factor in the transmission signal of W-CDMA system in the form of a graph based on the simulation and actually measured values. From FIG. 14, it is known that the peak factor increases rapidly when the number of multiplexes exceeds "3". Therefore, when the peak factor becomes large, since distortion of signal becomes large when the linearity of circuit to transmit the signal is not sufficient, the linearity of the transmission circuit must be improved.

As an index indicating linearity of circuit, an index called IPC (1 dB compression point) which indicates characteristic for transmission without distortion of signal is used. Hereinafter, this index is used in the description. Moreover, since it is known that the third order intercept point IP3 and saturation power Psat are also related to the ICP to a certain degree, the ICP in the description of the specification may be replaced with IP3 or Psat.

For transmission of a multiplex signal without any distortion, the range of linear characteristic of the transmission circuit, namely the dynamic range is generally widened as much as the peak factor. Namely, the signal can be amplified without distortion even when the number of multiplexes is "6" by designing a circuit of variable gain amplifying portion enough to accept the maximum level (maximum peak factor) to be inputted to the circuit. In more practical, it is understood from FIG. 14 that the peak factor when the number of multiplexes is "6" is increased by about 4.5 dB in comparison with the case where the number of multiplexes is "1". Therefore, when the ICP of the circuit is improved by 4.5 dB, deterioration of distortion characteristic due to increase in the number of multiplexes can be eliminated.

However, the maximum peak voltage which is a factor of peak factor is comparatively small and appears in average when the number of multiplexes is small as can be understood from FIG. 13(A), but when the number of multiplexes increases, the maximum peak voltage is no longer average and appears at random in the large value and small value with less appearing frequency of the comparatively large value as can be understood from FIG. 13(B). Accordingly, it is most desirable that IPC of the transmission circuit is improved by 4.5 dB in accordance with the peak factor. However, it is thought enough for practical use when the IPC is improved by about 3 dB.

FIG. 15 illustrates relationship between a current and 1 dB compression point ICP in the variable gain amplifying portion of a general code division multiplex transmission circuit in the mobile telephone of the W-CDMA system. From FIG. 15, it can be understood that the ICP can be increased by 3 dB by increasing a current of the variable gain amplifying portion by 100%.

On the other hand, there is provided a leak power ratio of adjacent channel ACLR as the specification to indicate distortion of the circuit in the W-CDMA transmission system. FIG. 16 illustrates relationship between the 1 dB compression point ICP and leak power ratio of adjacent channel ACLR in the variable gain amplifying portion of the ordinary code division multiplex transmission circuit of the W-CDMA system. From FIG. 16, it can be understood that the leak power ratio of adjacent channel ACLR can be improved by 6 dB by improving the 1 dP compression point ICP indicating the linearity of the circuit by 3 dB.

However, when the circuit is designed to operate the transmission circuit after it is fixed to the bias point which makes sufficient the ICP and ACLR like the point A' in FIG. 16 and the point B' in FIG. 15, the transmission signal is never distorted even when any signal is inputted and stable ACLR characteristic can be obtained. However, in this case, the current consumed by the circuit becomes always large without relation to the input signal.

The data transmitted in the W-CDMA system becomes 384 kbps in maximum when the number of multiplexes is "1" and 2 Mbps in maximum when the number of multiplexes is "6". However, the multiplexing is no longer required during communication by voice and during transmission of text data such as mails and the number of multiplexes is considered to be enough when it is "1". Increase in number of multiplexes is necessary only for transmission of moving image data, transmission of personal computer data and transmission of a large amount of data used in the Internet. Namely, the average amount of data transmitted from a mobile telephone is rather smaller than the maximum amount and it is not always required to set the number of multiplexes to "6". From such point of view, it is useless to always allow continuous flow of large current in order to attain linearity of the circuit in the conditions of recent years that the longer maximum waiting time and maximum communication time are required for the mobile telephone.

Therefore, in the present invention, an operation current of an amplifying circuit of the transmission system may be switched and the information about the number of multiplexes of data to be transmitted is supplied to the amplifying circuit of the transmission system from the baseband circuit. Thereby, change of current is controlled so as to make the current flow, to the amplifying circuit, for obtaining the minimum IPC required to keep linearity in the number of multiplexes even when the number of multiplexes of data changes.

According to the means described above, since dynamic range can be varied without almost changing gain of the amplifying circuit by changing a current flowing into the amplifying circuit, the signal can be transmitted without distortion by widening the dynamic range when the number of multiplexes is large and moreover current consumption can be lowered by reducing the current of the amplifying circuit when the number of multiplexes is rather small. In addition, since the 1 dB compression point ICP in the variable gain amplifying portion of the transmission circuit can be improved, the ACPR (leak power ratio to adjacent channels) characteristic can also be improved.

DETAILED DESCRIPTION OF THE PREFERRED EMBODIMENTS

The preferred embodiments of the present invention will be described with reference to the accompanying drawings.

Figure 1:
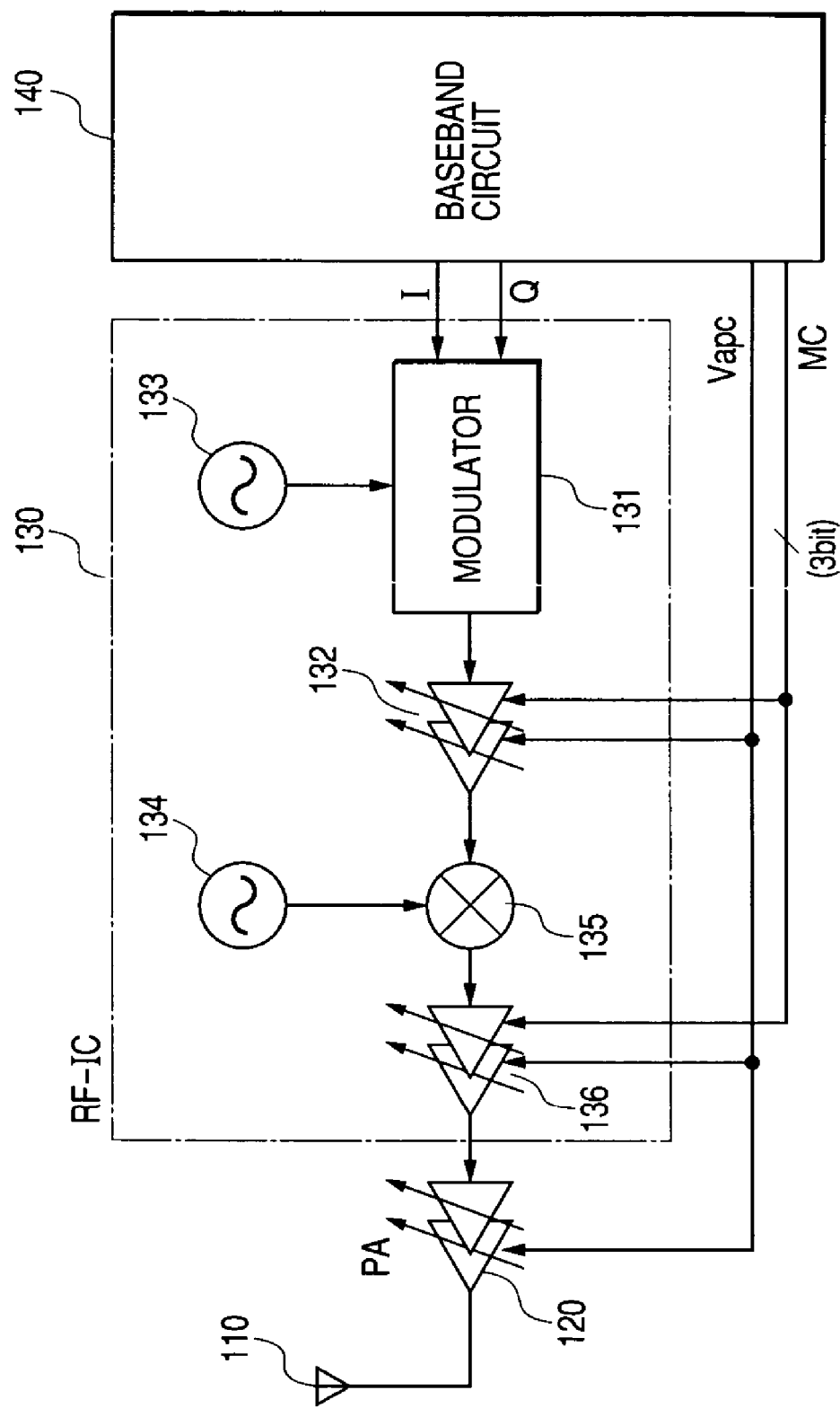
FIG. 1 is a block diagram showing a first embodiment of a transmission system circuit of a mobile telephone of the W-CDMA system to which the present invention is applied.

FIG. 1 illustrates an embodiment when the present invention is applied to a code division multiplex transmission circuit of a mobile telephone of the W-CDMA system.

As illustrated in FIG. 1, the mobile telephone of this embodiment comprises an antenna 110, a power module 120, a code division multiplex transmission circuit 130, and a baseband circuit 140. In view of simplifying the figure, a low noise amplifying circuit (LNA), a filter, an isolator, a coupler and a frequency synthesizer are not illustrated in the figure but these are naturally provided as required.

Although not restricted particularly, the code division multiplex transmission circuit 130 and baseband circuit 140 are formed, in this embodiment, on a semiconductor chip as a semiconductor integrated circuit device (RF-IC and baseband IC). Moreover, the power module 120 is formed as a semiconductor transistor for power amplification, a semiconductor integrated circuit in which a bias circuit is formed to give a bias to the transistor described above and an electronic component where a coupler is mounted on an insulated substrate such as ceramic. However, this power module may also be formed on one semiconductor chip as a semiconductor integrated circuit. In addition, although not illustrated in FIG. 1, a receiving circuit to amplify and modulate the signal received from the antenna 110 may be formed on the same chip as the semiconductor chip where the code division multiplex transmission circuit 130 is formed.

As illustrated in FIG. 1, the code division multiplex transmission circuit 130 of this embodiment includes a modulating portion 131, a first variable gain amplifying portion 132, a first local oscillator 133, a second local oscillator 134, a frequency conversion circuit 135 consisting of a mixer, and a second variable gain amplifying portion 136. In the code division multiplex transmission circuit 130, the I, Q signals outputted from the baseband circuit 140 are inputted to the modulating portion 131 which provides outputs through modulation of the local oscillation signal with the I and Q signals.

The first variable gain amplifying portion 132 amplifies the signal modulated in the modulating portion 131 and adjusts an average output level depending on the gain control signal Vapc from the baseband circuit 140. The frequency conversion circuit 135 inputs an output of the first variable amplifying portion 132 and an oscillation signal of the second local oscillator 134, and performs frequency conversion (up-conversion). The second variable amplifying portion 136 amplifies an output of the frequency conversion circuit 135 and then outputs the amplified signal to the power module 120. The second variable gain amplifying portion 136 also adjusts the average output level depending on the gain control signal Vapc from the baseband circuit 140. Moreover, the power module 120 amplifies an output of the second variable gain amplifying portion 136 and then transmits the transmission signal from the antenna 110. The power module 120 also adjusts the average output level depending on the gain control signal Vapc from the baseband 140.

Here, the transmission signal outputted from the variable gain amplifying portions 132, 136 vary the peak factor depending on the number of the code division multiplexes of the I and Q signals outputted from the baseband circuit 140. As described above, when the number of multiplexes increases, the maximum peak power becomes large although the average power does not change. This change of the maximum peak power will result in distortion of signal.

A base station which receives a transmission signal transmitted from the antenna 110 generates an output level instruction command TPC to set the signal level to the predetermined level depending on the average receiving level and then transmits this TPC signal. In the mobile telephone side, the baseband circuit 140 generates a gain control signal Vapc depending on this command and then supplies this gain control signal Vapc to the power module 120 and transmission circuit 130. However, since any attention is not paid to the maximum peak power, the signal of the transmission circuit 130 is distorted.

Therefore, in this embodiment, the variable amplifying portions 132 and 136 are configured to enable the switching of the operation currents, the control information MC of three bits indicating the number of code division multiplexes is supplied to the transmission circuit 130 from the baseband circuit 140, and the operation currents of the variable gain amplifying portions 132 and 136 are switched depending on this control information MC. In more practical, the operation currents of both first variable gain amplifying portion 132 and the second variable gain amplifying portion 136 or the operation current of any one thereof is switched so that when the number of multiplexes is small, the operation current decreases and when the number of multiplexes is large, the operation current increases.

Figure 14:
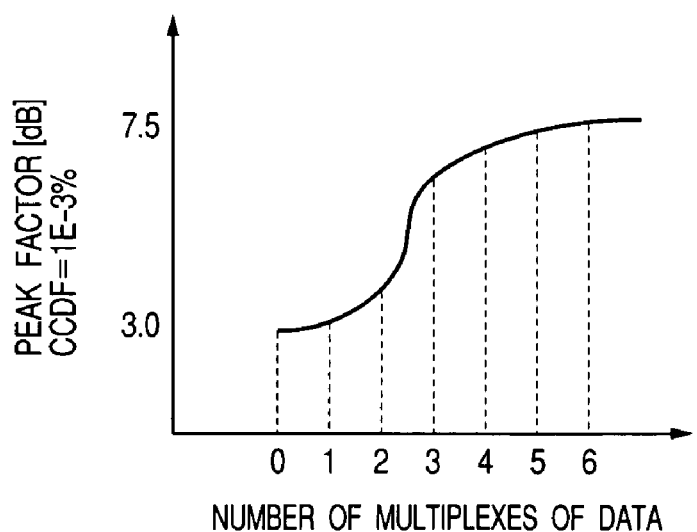
FIG. 14 is a graph showing relationship between the number of multiplexes and peak factor in the mobile telephone of the W-CDMA system.
Figure 15:
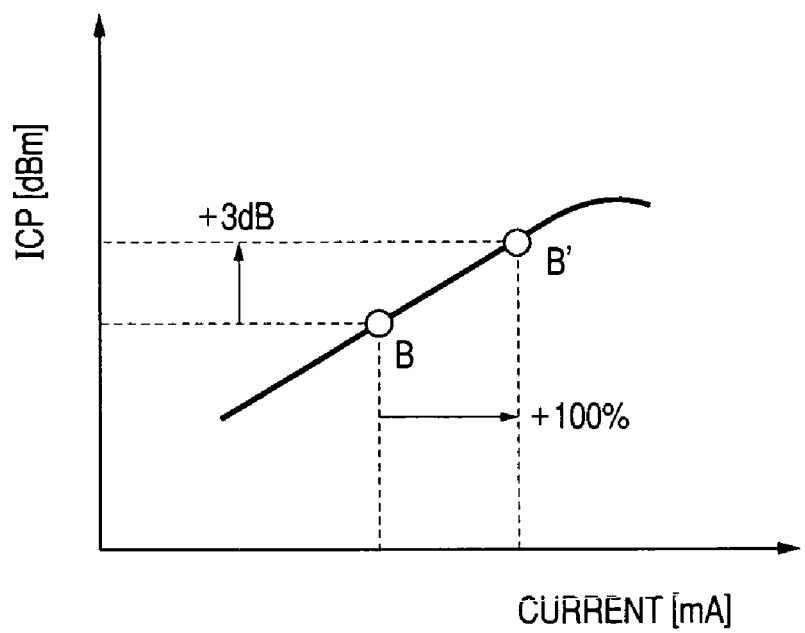
FIG. 15 is a graph showing relationship between a bias current and 1 dB compression point ICP in the variable gain amplifying portion of the code division multiplex transmission circuit of the mobile telephone of the W-CDMA system.
Figure 16:
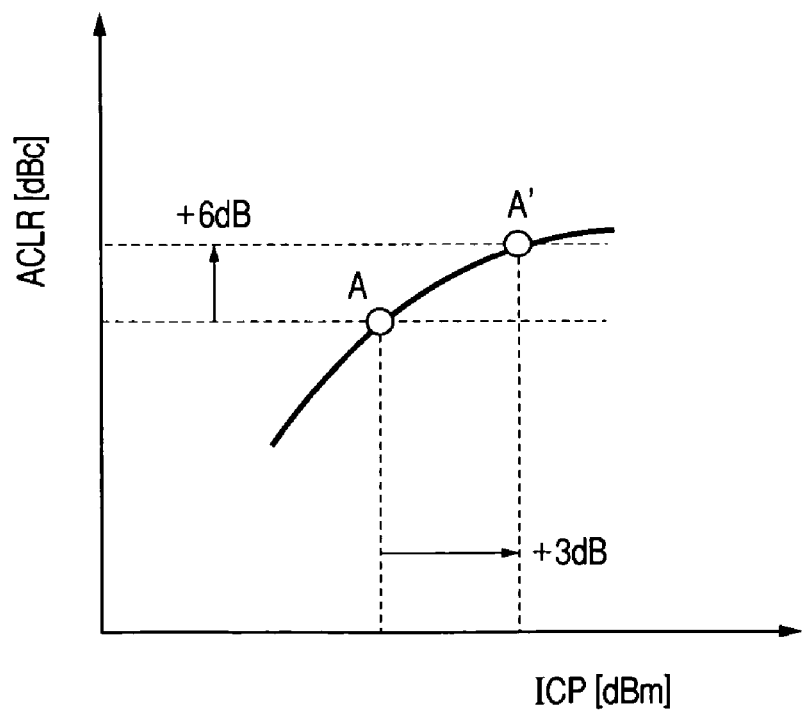
FIG. 16 is a graph showing relationship between 1 dB compression point ICP and leak power ratio of adjacent channels ACLR in the variable gain amplifying portion of the code division multiplex transmission circuit of the mobile telephone of the W-CDMA system.

Thereby, IPC, namely dynamic range of the variable gain amplifying portions 132, 136 is varied, the signal is amplified without distortion of signal and low current consumption may be attained. Amount of change of current due to the switching of the operation current is not linear for the number of multiplexes and is determined depending on the relationship between peak factor and number of multiplexes of FIG. 14. In other words, setting is made to provide the largest change while the number of multiplexes is within the range to "4" from "2". The variable gain amplifying circuit which can switch the operation current will be described later. In this embodiment, the control information MC indicating the number of multiplexes is given to the transmission circuit 130 as the code of three bits from the baseband circuit 140, but it may be given as the control voltage which takes any voltage level of seven levels.

Figure 2:
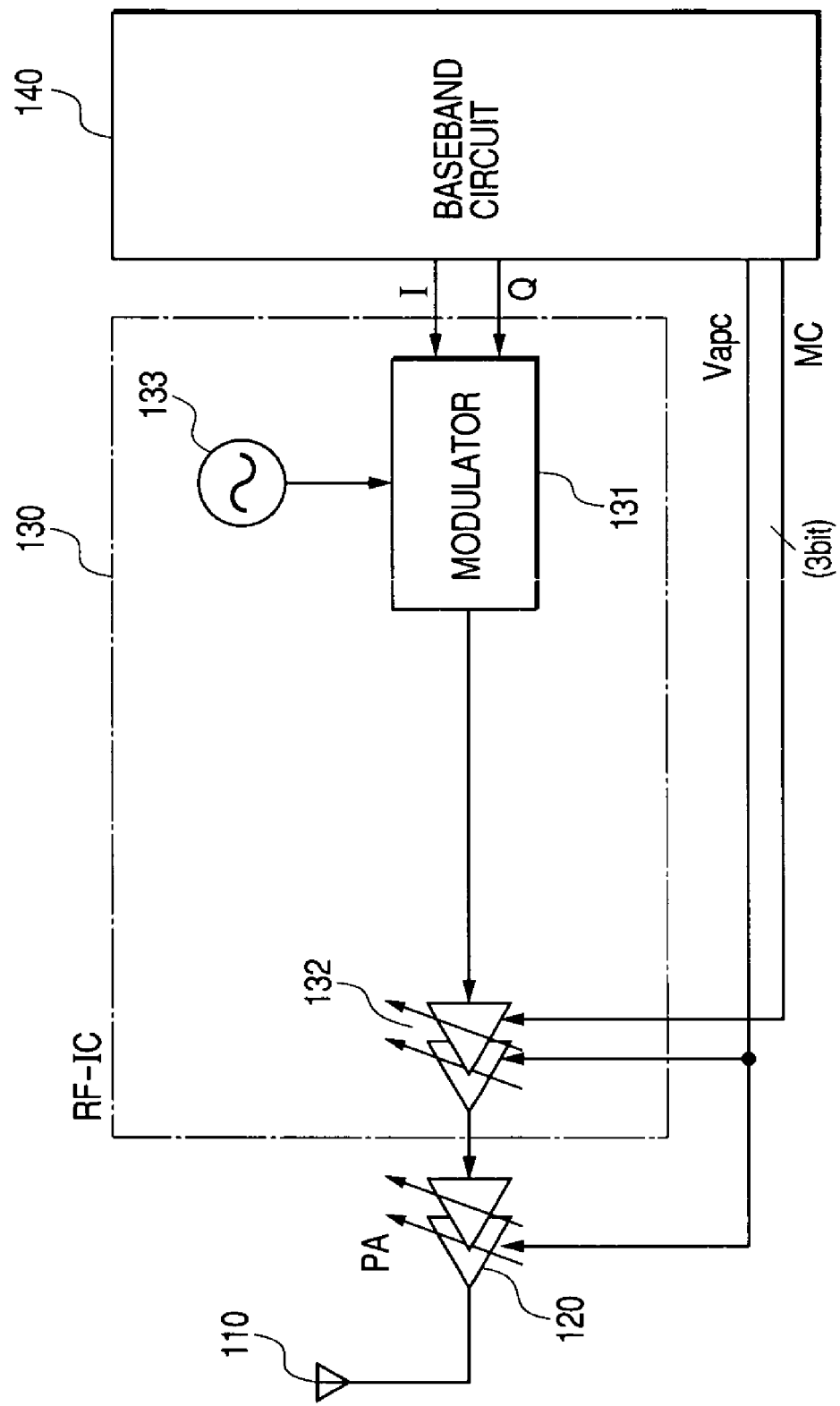
FIG. 2 is a block diagram showing a second embodiment of the transmission system circuit of the mobile telephone of the W-CDM system to which the present invention is applied.

FIG. 2 illustrates the second embodiment where the present invention is applied to a code division multiplex transmission circuit of a mobile telephone of the W-CDMA system. In the transmission circuit of the first embodiment, the transmission signal is up-converted in two stages up to the desired frequency using oscillation signals of two local oscillators 133, 134, while in the transmission circuit of this second embodiment, the transmission signal is quickly up-converted up to the desired transmission frequency using the oscillation signal of one local oscillator 133.

Moreover, in this second embodiment, the average output levels of the variable gain amplifying portion 132 and power module 120 is adjusted depending on the gain control signal Vapc from the baseband circuit 140, the control information MC indicating the number of code division multiplexes is supplied to the transmission circuit 130 from the baseband circuit 140, and the operation current of the variable gain amplifying portion 132 is switched depending on the control information MC. Even in this embodiment, the control information MC indicating the number of multiplexes may be any one of the 3-bit code or the control voltage of seven voltage levels.

Figure 3:
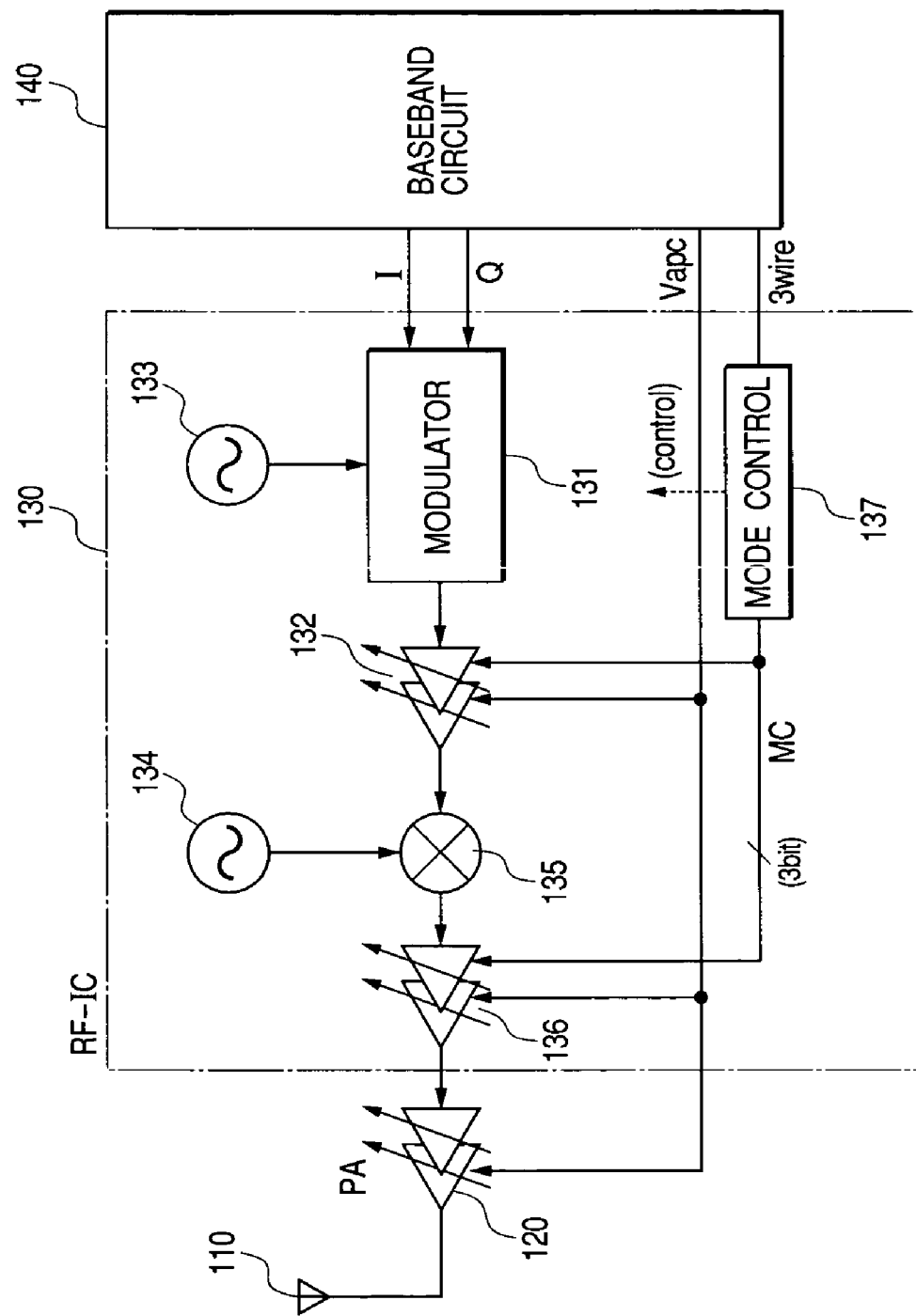
FIG. 3 is a block diagram showing a third embodiment of the transmission system circuit of the mobile telephone of the W-CDMA system to which the present invention is applied.
Figure 4:
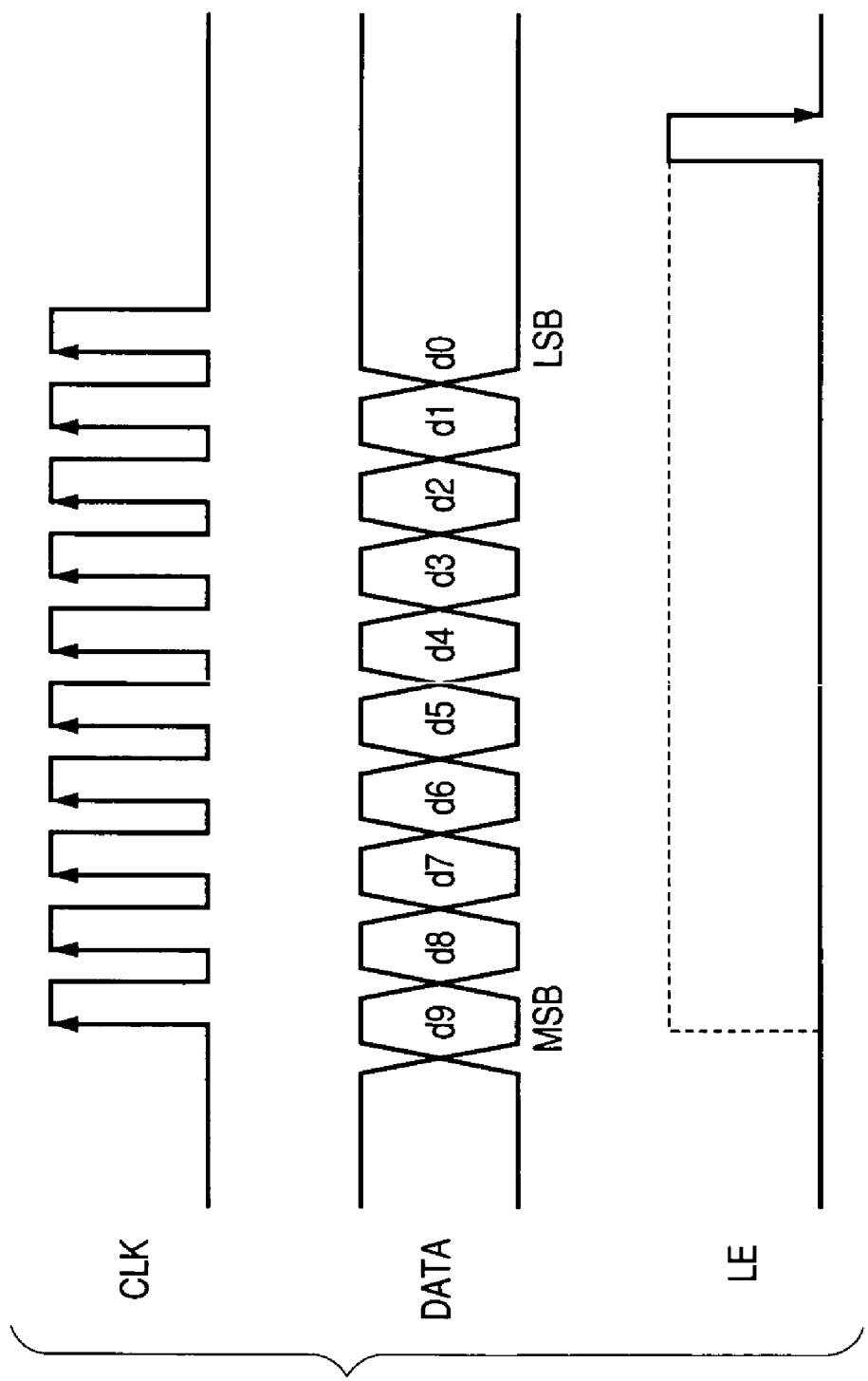
FIG. 4 is a timing chart showing the transmission timing of a control system signal between a baseband circuit and the transmission system circuit in the mobile telephone of the embodiment of FIG. 3.

FIG. 3 and FIG. 4 illustrates a third embodiment when the present invention is applied to the code division multiplex transmission circuit of the mobile telephone of the W-CDMA system. This embodiment is different from the first embodiment only in the method of applying the control information MC indicating the code division multiplexes given to the transmission circuit 130 from the baseband circuit 140, and is identical to the first embodiment in the point that the operation currents of the variable gain amplifying portions 132, 136 are switched depending on the control information MC indicating the number of multiplexes.

In more practical, the transmission circuit 130 of the third embodiment is provided with a mode control circuit 137 which controls the interior of the RF-IC chip such as power ON/OFF of the transmission circuit and setting of frequency of the local oscillators 133, 134 depending on the mode control signal for designating each operation mode supplied from the baseband circuit 140. The mode control circuit 137 and the baseband circuit 140 are connected with three signal lines. One of the three signal lines is a signal line to supply the clock signal CLK, another signal line is used for serial transfer of the data DATA and the remaining signal line is used to supply the load enable signal LE which allows fetching of the data.

The mode control circuit 137 of this embodiment is provided, although not particularly restricted, with a 10-bit shift register and a 10-bit control register. The serial data DATA is fetched by the shift resistor and is then shifted in synchronization with the clock CLK supplied from the baseband circuit 140 in the timing shown in FIG. 4 and the data of shift register is latched simultaneously to the control register in synchronization with the fall of the load enable signal LE. In FIG. 4, a broken line given to the load enable signal LE indicates that the data fetched by the shift register in this period is valid.

In this embodiment, the 3-bit control information MC indicating the number of multiplexes is supplied to the transmission circuit 130 from the baseband circuit 140 using three signal lines connecting between the mode control circuit 137 and baseband circuit 140. In this case, the control information MC indicating the number of multiplexes is also given the code indicating that it is the multiplex number information and it is also transmitted together. Accordingly, the mode control circuit 137 extracts the control information MC indicating the number of multiplexes from the data fetched by the shift register and then gives this control information MC to the variable gain amplifying portions 132, 136.

Next, a practical circuit example of the amplifying circuit which can vary the operation current, namely dynamic range will be disclosed.

Figure 5:
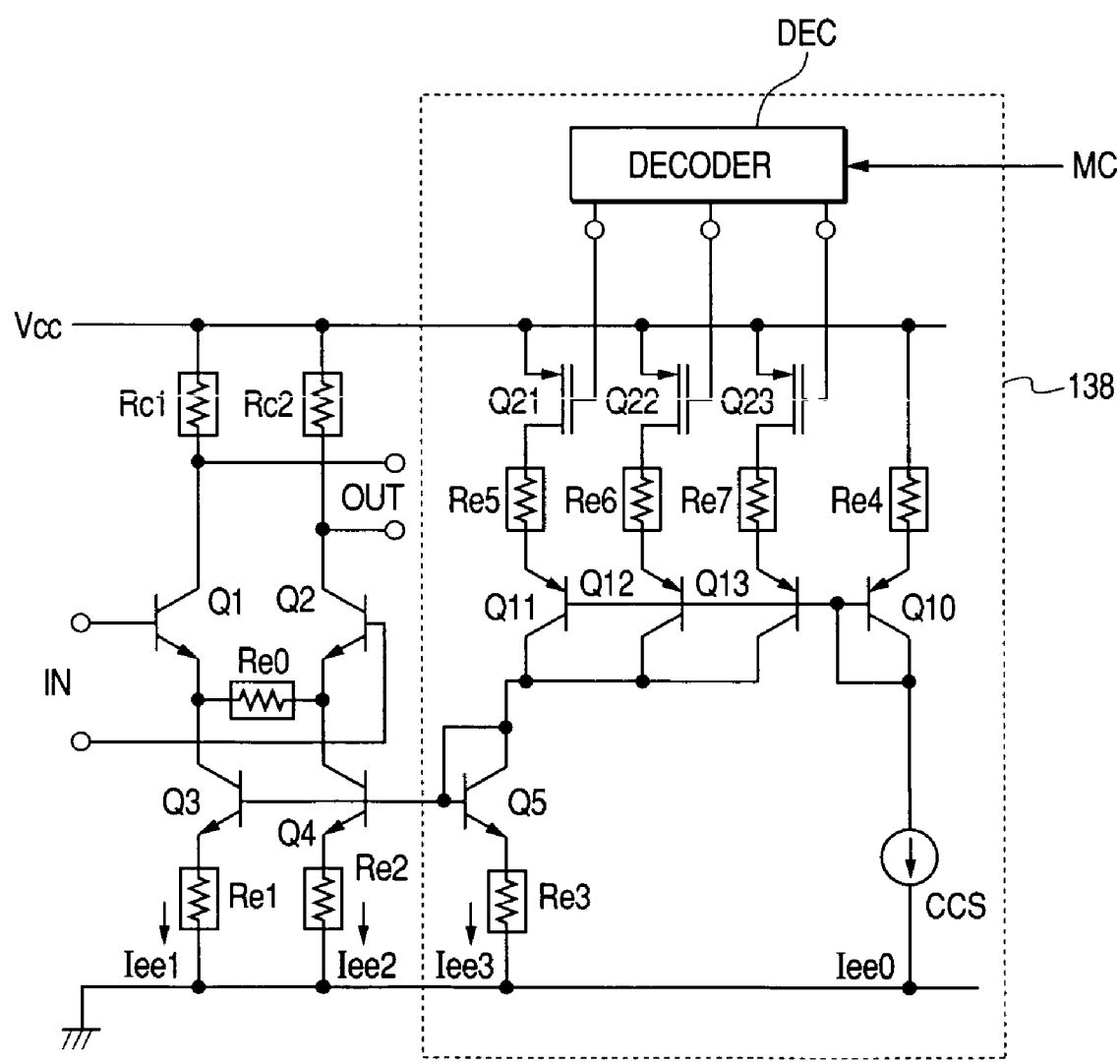
FIG. 5 is a circuit diagram showing a practical example of a variable gain amplifying circuit which can vary the dynamic range and a current switching circuit in the transmission system circuit.

FIG. 5 is an example of the amplifying circuit consisting of a bipolar transistor. The amplifying circuit of this embodiment is formed of a pair of input differential transistors Q1, Q2, a resistor Re0 connected between the emitters of the transistors Q1, Q2, collector load resistors Rc1, Rc2 connected between the collectors of transistors Q1, Q2 and the power supply voltage terminal Vcc, a differential amplifying stage consisting of constant current transistors Q3, Q4 connected between the emitters of the transistors Q1, Q2 and the grounding point, and a current switching circuit 138 for switching the currents of the constant current transistors Q3, Q4.

The current switching circuit 138 is formed of a transistor Q5 current-Miller connected with the constant current transistors Q3, Q4, a constant current source CCS, a transistor Q10 connected in series to the constant current source CCS between the power supply voltage terminal Vcc and the grounding point, transistors Q11, Q12, Q13 current-Miller connected to the transistor Q10, switching MOSFETs Q21, Q22, Q23 connected in series to these transistors Q11, Q12, Q13, and a decoder DEC for generating the ON/OFF control signal impressed to the gate terminals of the switching MOSFETs Q21, Q22, Q23 by decoding the 3-bit control information MC indicating the number of multiplexes supplied from the baseband circuit 140.

Q1 to Q5 of the transistors are NPN transistors, while Q10 to Q13 are PNP transistors, Q3 to Q5 are connected with emitter resistors Re1 to Re3, and Q10 to Q13 are connected with emitter resistors Re4 to Re7. Moreover, the transistors Q11 to Q13 form a current adding circuit with common connection of collectors and a current added with this adding circuit is applied to the transistor Q5 as a collector current.

The amplifying circuit of this embodiment is configured to change in seven levels the current of the constant current transistors Q3, Q4 by switching the current flowing into the transistor Q5 with the 3-bit control information MC. Moreover, the current of the constant current transistors Q3, Q4 may be varied not depending on the constant changing rate but depending on the characteristic curve of FIG. 14, by adequately setting the combination of an emitter size ratio of the transistors Q10 to Q13 and the MOSFETs Q21 to Q23 which are turned ON with the control information MC.

The amplifying circuit of this embodiment is expressed as $$gmQ1=1/(reQ1+RE) \tag{1}$$

when a resistance value of emitter resistor Re0 of the input differential transistors Q1, Q2 is RE, a resistance value of collector resistor Rc1 is RL, a mutual conductance of the input differential transistor Q1 is gmQ1 and an operation resistance when the collector current Iee is flowing is reQ1.

Therefore, gain G1 is expressed as follows.

$$G1=gmQ1 \cdot RL=RL/(reQ1+RE) \tag{2}$$

Here, since the operation resistance re of a bipolar transistor is expressed as re=2 kT/qI when k is the Bortzman's constant, q is amount of charges and T is the absolute temperature, the operation resistance when the current I is 1 mA becomes about 26 Ω. This value is so small as to be neglected in comparison with the emitter resistance Re inserted in general. Since the item of current I is not included in the formula (2), it can be understood from the formula (2) that gain does not change in the circuit of FIG. 5 even when the current Iee is changed.

Meanwhile, the dynamic range of this amplifying circuit is ±kT/q=±26 mV when the emitter resistance Re0 is 0 Ω, but it is enlarged up to Iee·RE when the emitter resistance Re0 takes a finite value. Therefore, the amplifying circuit of this embodiment can change dynamic range while keeping the gain to a constant value by changing the current Iee.

Figure 6:
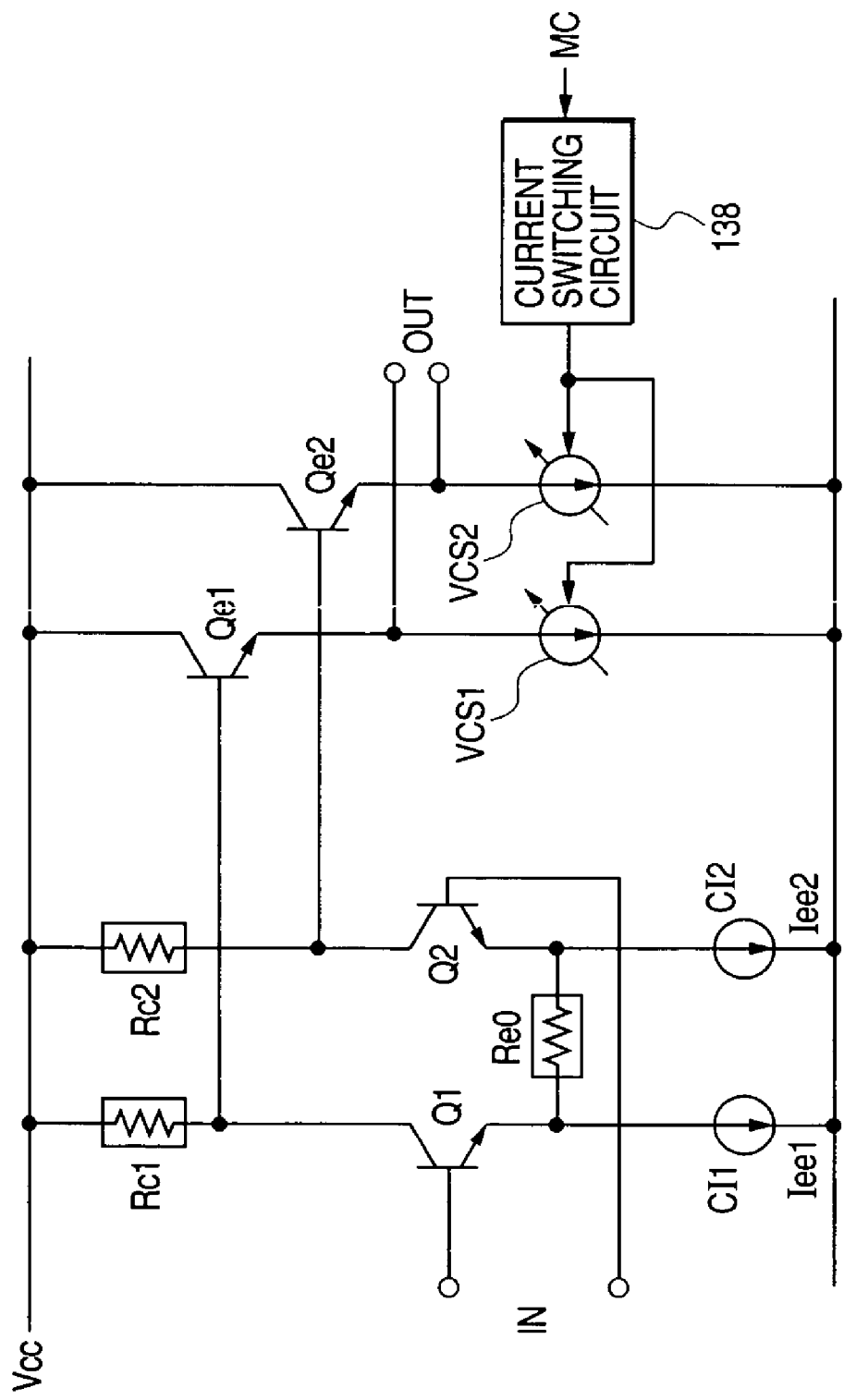
FIG. 6 is a circuit diagram showing another example of the variable gain amplifying circuit which can vary the dynamic range.

The amplifying circuit which can vary dynamic range is never limited to the circuit of FIG. 5 and it may be the circuit, for example, using N channel MOSFETs in place of the bipolar transistors Q1 to Q5 of FIG. 5 and P channel MOSFETs in place of the transistors Q10 to Q13. Moreover, it is also possible to introduce the circuit, as illustrated in FIG. 6, where the dynamic range is changed by using the variable current sources VCS1, VCS2 as the current source in the emitter side of the emitter follower transistors Qe1, Qe2 of the subsequent stage of the differential amplifying stage, and switching the currents of the variable current sources VCS1, VCS2 by the circuit similar to the current switching circuit 138 consisting of the constant current source CCS, transistors Q10 to Q13, Q21 to Q23 and the decoder DEC. In FIG. 6, CI1 and CI2 are constant current sources consisting of a transistor where a constant potential is applied to the base and a resistor connected to the emitter of the same transistor.

The amplifying circuit which can change IPC, namely the dynamic range has been described above. In the embodiments illustrated in FIG. 1 to FIG. 3, the amplifying circuits 132, 136 are designed as the amplifying circuits which can vary the gain with the gain control voltage Vapc from the baseband circuit 140. Meanwhile, the amplifying circuit of FIG. 5 fixes the gain thereof. Therefore, an example of the amplifying circuit of which gain is fixed will be described with reference to FIG. 7 and FIG. 8.

Figure 7:
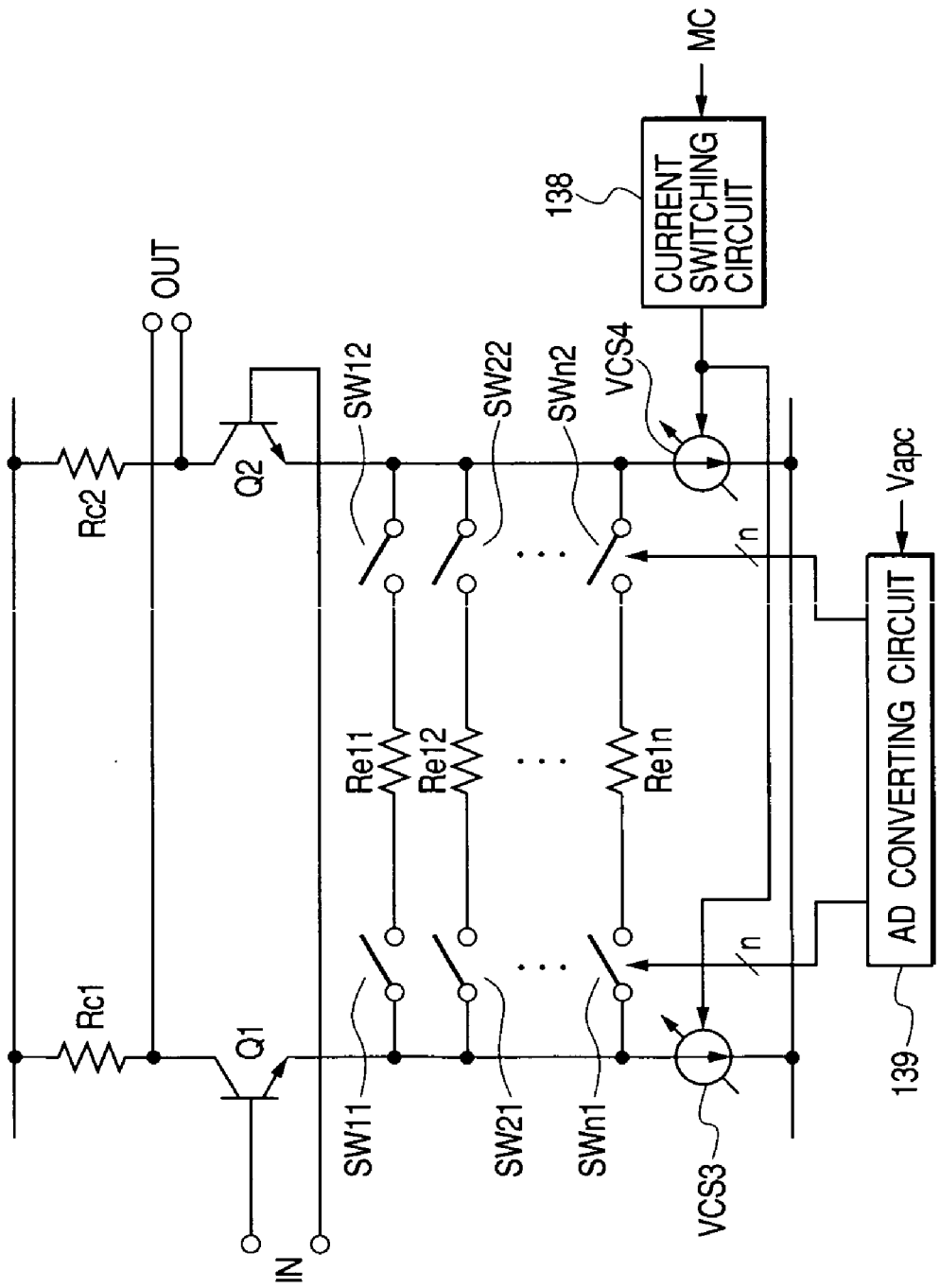
FIG. 7 is a circuit diagram showing a practical example of the gain variable amplifying circuit in the transmission system circuit.
Figure 8:
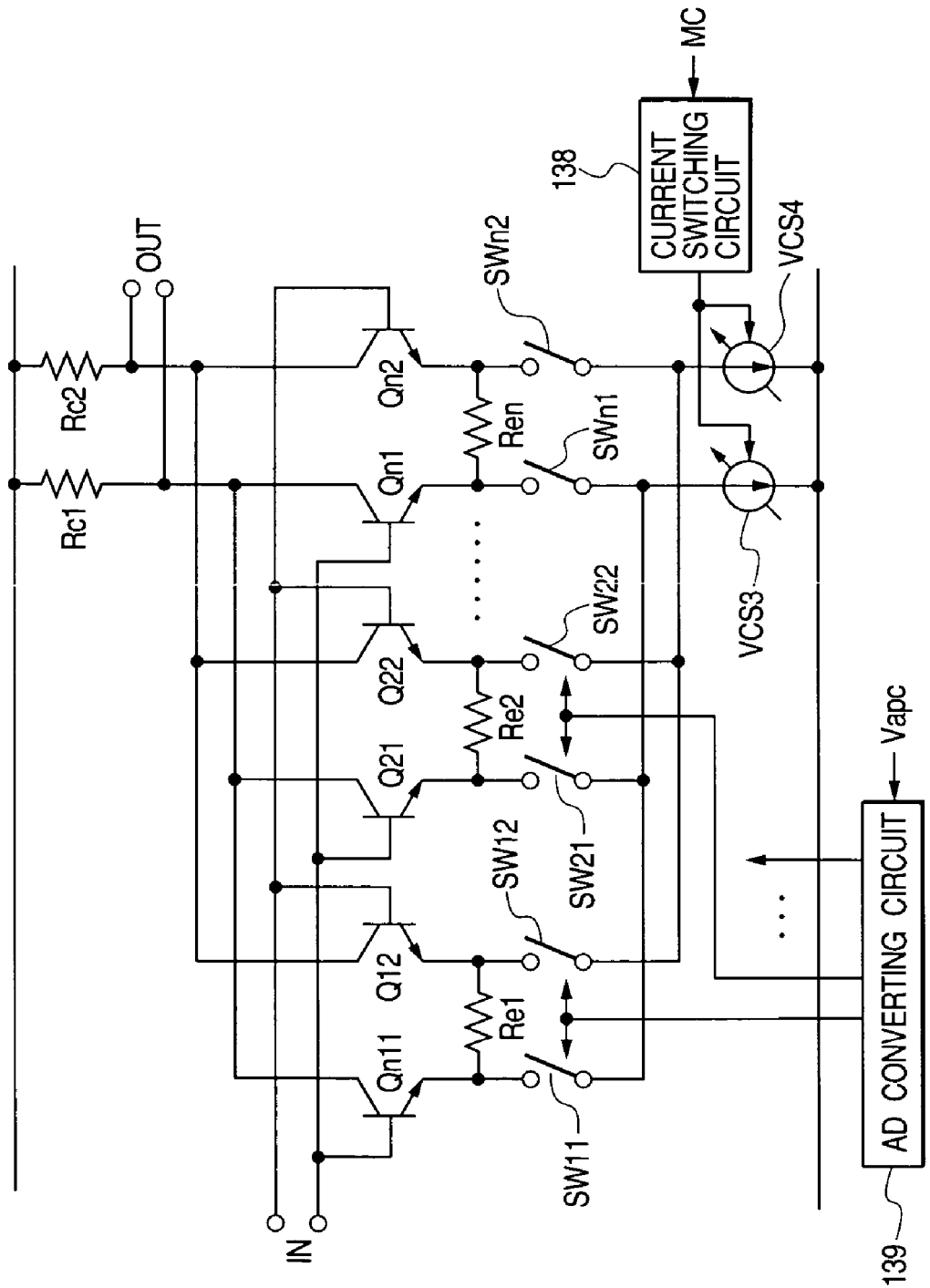
FIG. 8 is a circuit diagram showing the other example of the gain variable amplifying circuit.

FIG. 7 and FIG. 8 illustrate examples of the variable gain amplifying circuit which is configured to change step by step the gain thereof. The variable gain amplifying circuit of FIG. 7 is provided with a plurality of resistors Re11, Re12, ..., Re1n connected in parallel between the emitters of a couple of input differential bipolar transistors corresponding to the Q1 and Q2 in the circuit of FIG. 5. These resistors are connected or disconnected with the switches SW11, SW12; SW21, SW22, . . . , SWn1, SWn2.

Moreover, an AD converting circuit 139 for converting the gain control voltage Vapc from the baseband circuit 140 to a digital code is also provided, the ON/OFF conditions of the switches SW11, SW12; SW21, SW22, . . . , SWn1, SWn2 are set with an output of this AD converting circuit 139 and the gain can be varied depending on the combination of the switches to set the ON condition. The resistors Re11, R312, . . . , Re1n may have the identical resistance value but the number of resistors may be reduced by forming these resistors, for example, to have the weight of 2×n.

The variable gain amplifying circuit of FIG. 7 operates as the amplifier having a small gain as the resistance value of resistor connected between the emitter terminals of the differential bipolar transistors Q1, Q2 is larger. Therefore, in the variable gain amplifying circuit of this embodiment, an output of the AD converting circuit 139 is distributed to the switches SW11, SW12; SW21, SW22, . . . , SWn1, SWn2 so that as the gain control voltage Vapc from the baseband circuit 140 is larger, more switches are turned ON among the switches SW11, SW12; SW21, SW22; . . . , SWn1, SWn2, or as the gain control voltage Vapc is higher, the switch corresponding to the resistor having smaller weight resistance is turned ON.

Here, VCS3, VCS4 are variable constant current sources consisting of the constant current transistors Q3, Q4 and the emitter resistors Re1, Re2 thereof. Although not illustrated in FIG. 7, the variable constant current sources VCS3, VCS4 are configured to be switched in the current thereof with the current switching circuit 138 of the structure identical to that of FIG. 5 based on the control information MC indicating the number of multiplexes and to vary the dynamic range of the circuit. The switches SW11, SW12; SW21, SW22, . . . , SWn1, SWn2 may also be configured to realize the ON/OFF control with the signal obtained by decoding an output of the AD converting circuit 139 with a decoder provided, in place of direct ON/OFF control using an output of the AD converting circuit 139.

In the variable gain amplifying circuit of FIG. 8, the differential bipolar transistors Q11, Q12; Q21, Q22, . . . , Qn1, Qn2 of a plurality of sets forming pairs are connected and the resistors Re1, Re2, . . . , Ren having identical or different resistance values to or from one another are respectively connected between the emitters of transistors of each pair. Moreover, the emitters of the transistors Q11, Q12; Q21, Q22, . . . , Qn1, Qn2 are connected or isolated to or from the common current sources VCS2, VCS4 via the switches SW11, SW12; SW21, SW22, . . . , SWn1, SWn2. The transistors Q11, Q12; Q21, Q22, . . . , Qn1, Qn2 may be formed in the same size or may be formed as the transistors of different emitter sizes.

The variable gain amplifying circuit of FIG. 8 operates as the amplifier of smaller gain as the smaller number of bipolar transistors are connected to the switch to be turned ON, namely the current sources VCS3, VCS4, or the bipolar transistors connected to the current sources VCS3, VCS4 have the smaller emitter size.

Therefore, in the variable gain amplifying circuit of this embodiment, an output of the AD converting circuit 139 is distributed to the switches SW11, SW12; SW21, SW22; . . . , SWn1, SWn2 so that as the gain control voltage Vapc supplied from the baseband circuit 140 is higher, more switches are turned ON among the switches SW11, SW12; SW21, SW22, . . . , SWn1, SWn2, or as the gain control voltage Vapc is higher, the switches corresponding to the transistor having larger emitter size are turned ON, otherwise, as the gain control voltage Vapc from the baseband circuit 140 is lower, less switches are turned ON among the switches SW11, SW12; SW21, SW22, . . . , SWn1, SWn2, or as the gain control voltage Vdpc is lower, the switches corresponding to the transistor having smaller emitter size are turned ON.

Rc1, Rc2 are common collector resistors, and VCS3, VCS4 are variable constant current sources. The dynamic range is made variable by switching the current with the current switching circuit 138 based on the control information MC indicating the number of multiplexes supplied from the baseband circuit 140. The switches SW11, SW12; SW21, SW22, . . . , SWn1, SWn2 are controlled for ON and OFF with an output of the AD converting circuit 139 for converting the output control voltage Vapc from the baseband circuit 140 into a digital code. The output control voltage from the baseband circuit 140 may be an analog voltage but it is also possible that this output voltage is given with the digital code.

Moreover, in above embodiment, the dynamic range of the variable gain amplifying portions 132 and 136 may be varied but it is also possible that a mixer 135 illustrated in FIG. 1 and FIG. 3 is configured to switch the operation current, the dynamic range can be varied by switching the operation current of the mixer 135 based on the control information MC indicating the number of multiplexes and thereby distortion of signal may be reduced by controlling increase of the current consumption.

Figure 9:
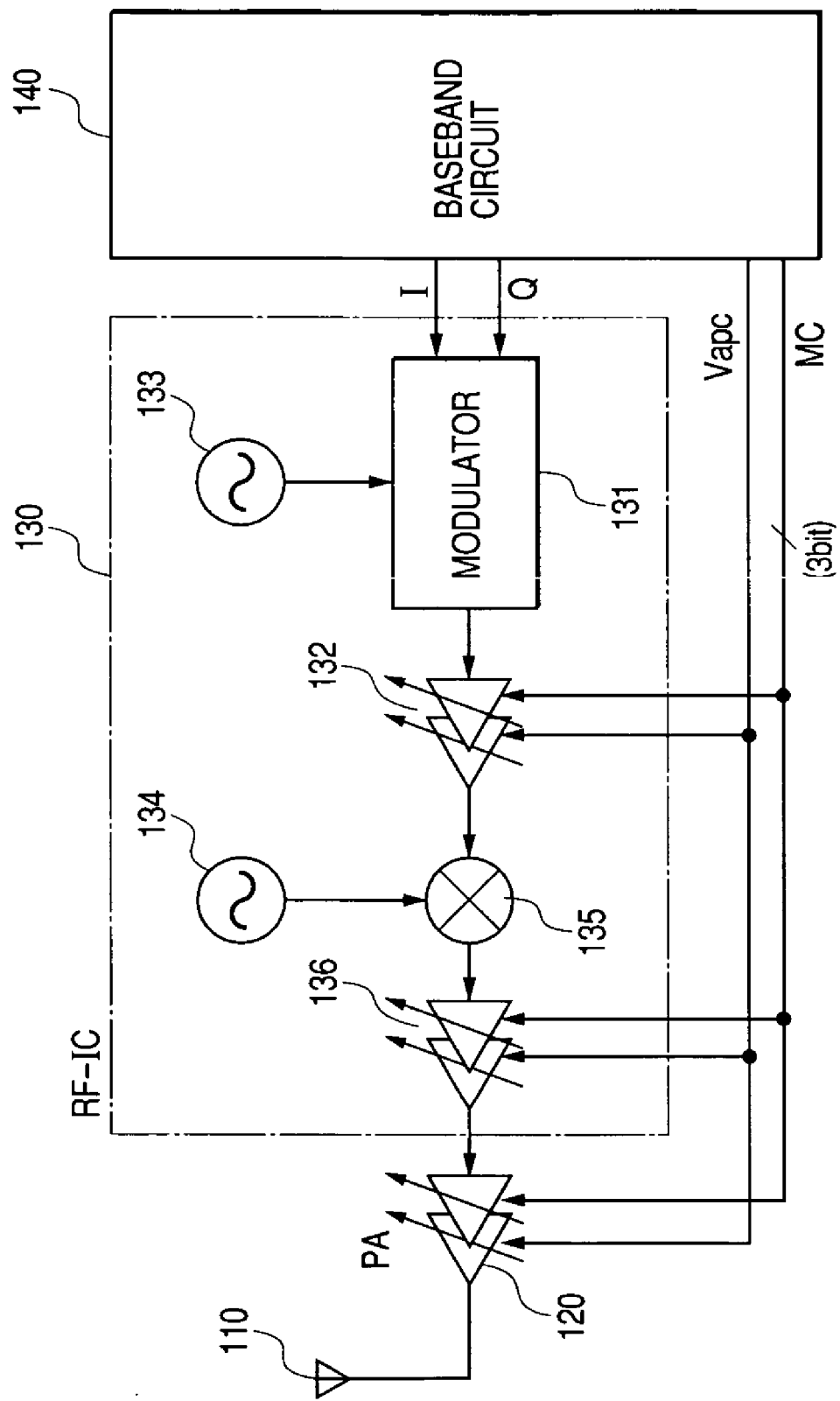
FIG. 9 is a block diagram showing a fourth embodiment of the transmission system circuit of the mobile telephone of the W-CDMA system to which the present invention is applied.

The other embodiment of the present invention will be described with reference to FIG. 9 and FIG. 10.

This embodiment varies the dynamic range of the first variable gain amplifying portion 132 and the second variable gain amplifying portion 136 in the transmission circuit 130 based on the control information MC indicating the number of multiplexes supplied from the baseband circuit 140 and also varies the dynamic range of the power amplifier (high frequency power amplifying circuit) in the power module 120. FIG. 10 shows a power amplifier circuit whose dynamic range is variable.

Figure 10:
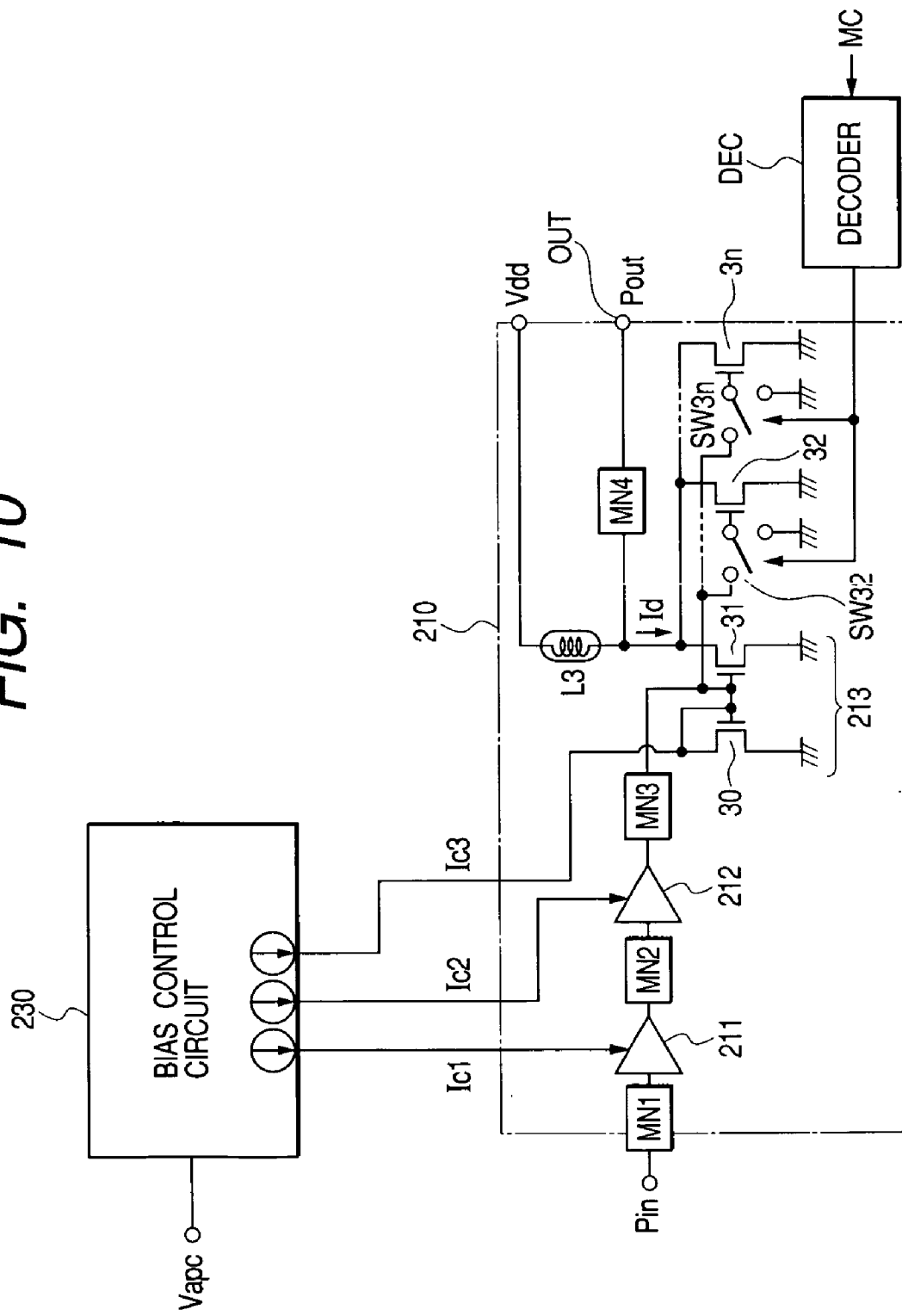
FIG. 10 is a circuit diagram showing a practical example of a power module in the mobile telephone of the embodiment of FIG. 9.

In the power amplifier illustrated in FIG. 10, three amplifying stages 211, 212, 213 are cascade-connected via the impedance matching circuits MN1 to MN3. In each amplifying stage, a field effect transistor for power amplification (hereinafter, the field effect transistor is referred to as FET) is provided and FIG. 10 illustrates a practical circuit structure of the final amplifying stage 213. Although not illustrated in the figure, the amplifying stages 211, 212 of the first and second stages have the structure similar to that of the final amplifying stage. MN4 is an impedance matching circuit connected between the drain terminal of the FET of the final amplifying stage 213 and the output terminal OUT, while the matching circuits MN1 to MN4 are respectively formed an inductance element and a capacitance element consisting of the microstrip line formed on the ceramic substrate.

The final amplifying stage 213 is formed of an FET 31 for power amplification to receive an output of the preceding amplifying stage 212 with the gate terminal via the impedance matching circuit MN3 and an FET 32 current-Miller connected with the FET 31. A power source voltage Vdd is impressed to the drain terminal of the FET 31 via an inductance element L3. Since the control current Ic3 supplied from the bias control circuit 230 is applied to the current Miller FET 32, the drain current Id which is identical to this current or is proportional to this current is impressed to the FET 31. The amplifying stages 211, 212 of the first and second stages are similarly constituted.

As described above, the signal Pout where the DC element of the high frequency input signal Pin is cut and the AC element is amplified up to the predetermined level can be outputted by controlling the amplification degree of each stage with the bias currents Ic1, Ic2, Ic3 which are given to each amplifying stage 211 to 213 by the bias control circuit 230. The control signals Ic1, Ic2, Ic3 are generated by the bias control circuit 230 depending on the gain control voltage Vapc supplied from the baseband circuit 140 to provide the predetermined output power with the amplifying stages 211 to 213 as a whole.

In this embodiment, a plurality of FETs 32, ..., FET3$n$ are connected in parallel to the FET 31 of the final amplifying stage 213, and the change-over switches SW32, ..., SW2$n$ are provided between the gate terminals of these FET 32, ..., FET 3$n$ and the gate terminal of the FET 31. The FETs 32, ..., FET 3$n$ are formed as the element in the size (gate width) which is smaller than the FET 31. The switches SW 31, ..., SW 3$n$ are controlled with an output of the decoder DEC for decoding the control information MC indicating the number of multiplexes from the baseband circuit 140 and are configured to selectively impress the voltage identical to the gate voltage of the FET 31 or the grounding voltage to the gate terminals of the FET 32, ..., FET 3$n$. Under the condition that all switches SW 31, ..., SW 3$n$ are changed over to the side to impress the ground potential to the gate terminals of the FET 32, ..., FET 3$n$, only the FET 31 performs the amplifying operation. When the number of switches changed over to the side to impress the voltage identical to the gate voltage of the FET 31 to the gate terminals of the FET 32, ..., FET 3$n$ increases, a drain current of the final amplifying stage 213 increases to expand the dynamic range.

In this embodiment, the gain is also increased a little by increasing the drain current of the final amplifying stage 213, the greater part of the gain required for the power amplifier 210 as a whole is attained with the first and second amplifying stages 211, 212, and the FET 31 of the final stage is designed to operate in the manner that the predetermined output power can be obtained by applying a current when the gain (voltage gain) is almost equal to "1". Accordingly, only the dynamic range can be widened while the gain is kept almost to the constant value by increasing the drain current of the finals stage depending on the multiplex number information MC. Moreover, in the case where the gain changes exceeding the allowable value by increasing the drain current to the final amplifying stage, the control may be realized to change, in the reverse direction, the gain of the first and second amplifying stages depending on such change of the gain.

Moreover, in the embodiment of FIG. 10, the dynamic range is made variable by providing a plurality of FET 32, ..., FET 3$n$ in parallel to the FET 31 of the final amplifying stage 213. However, it is also possible, as illustrated in FIG. 11, to form the circuit to change the dynamic range, by providing the current source CCS3 to give the bias current Ic3 of the FET 31 of the final amplifying stage 213 as the variable current source, and varying the drain current of the FET 31 by switching the current Ic3 of the variable current source with the circuit similar to the current switching circuit 138 consisting of the constant current source CCS, transistors Q10 to Q13, Q21 to Q23 and the decoder DEC of FIG. 5.

Figure 11:
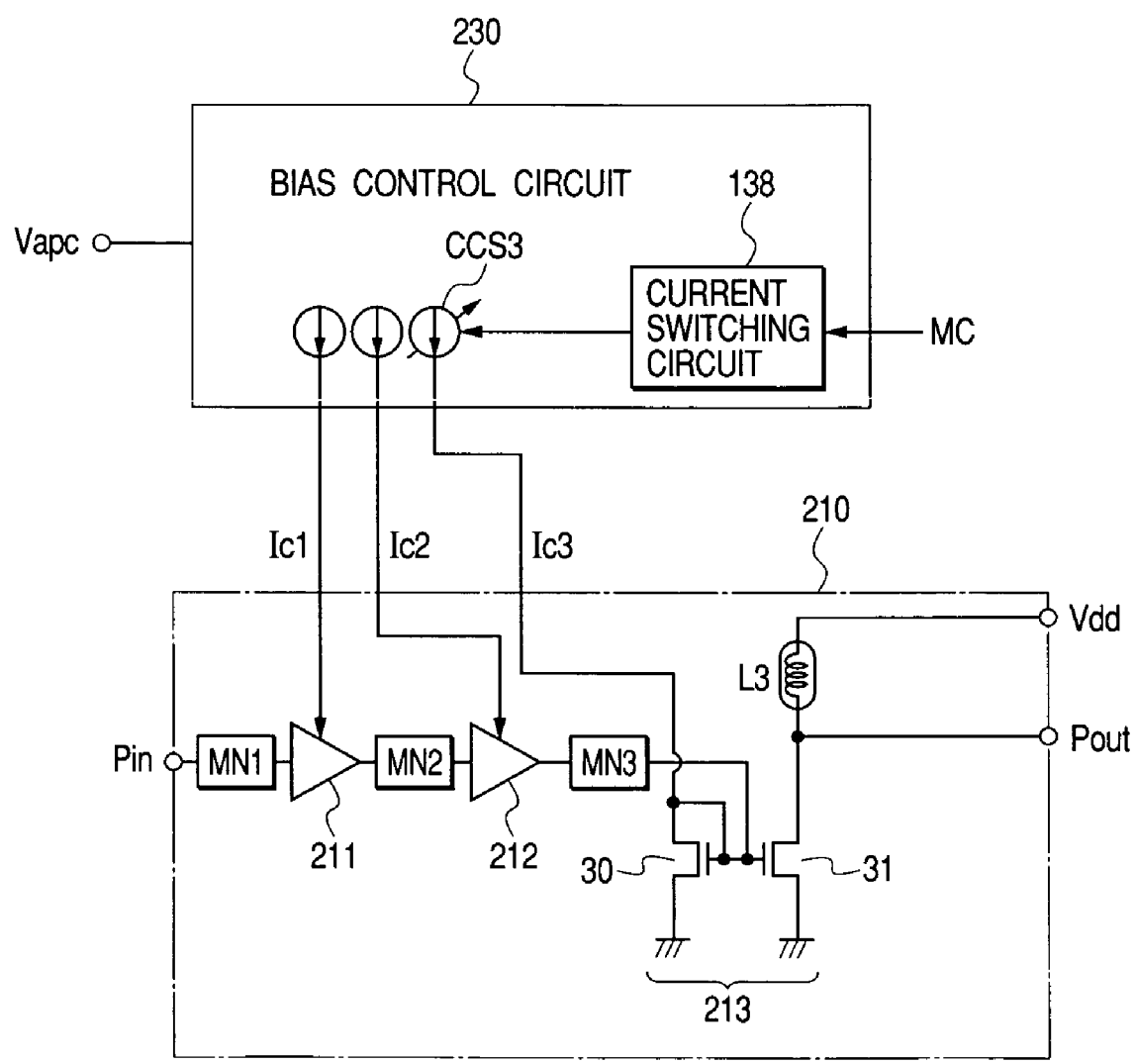
FIG. 11 is a circuit diagram showing the other example of the power module in the mobile telephone of the embodiment of FIG. 9.
Figure 12A:
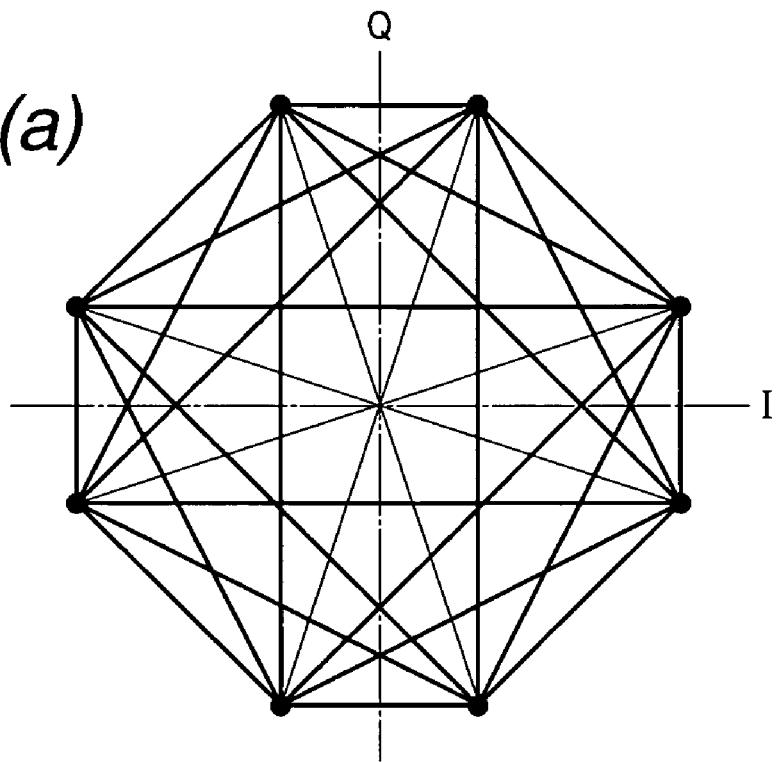
FIGS. 12(A) and 12(B) are the constellation diagrams indicating, on the IQ coordinates, the position and changing direction of each symbol of the signal generated by the code division diffusing process (multiplexing) performed in the baseband circuit.
Figure 12B:
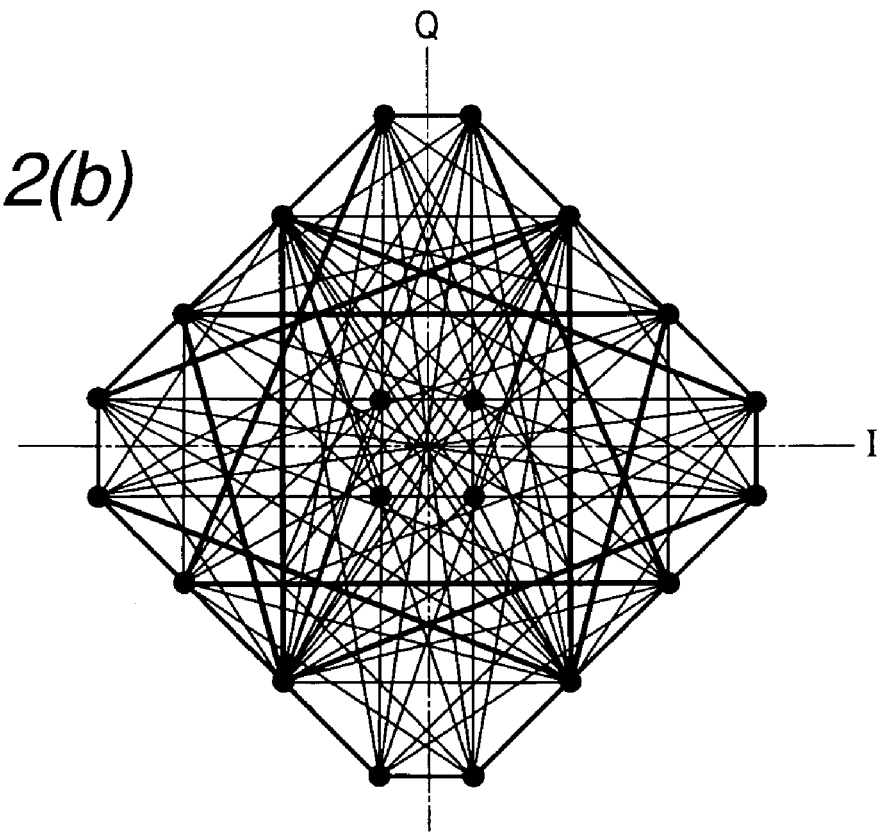
Figure 13A:
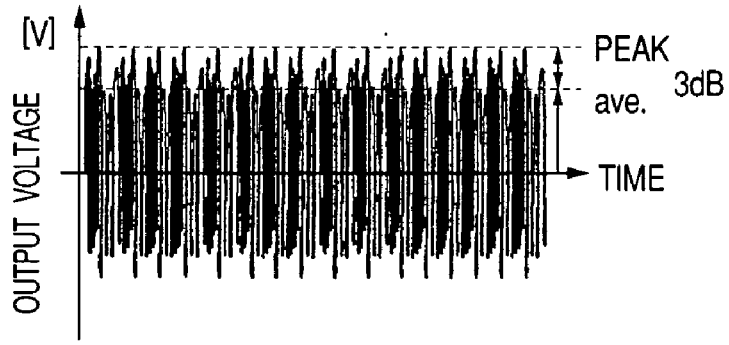
FIGS. 13(A) and 13(B) are waveform diagrams showing waveform images of the transmitting signal when the number of multiplexes is "1" and "6" in the W-CDMA system.
Figure 13B:
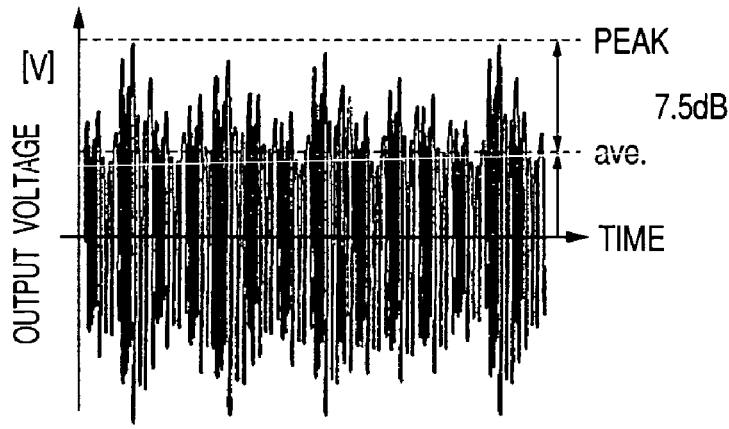

As the power amplifying transistor 31 of the final stage and the transistors of the first and second amplifying stages, FETs are used in the embodiments of FIG. 10 and FIG. 11. However, it is also possible to use the other transistors such as bipolar transistor, GaAsMESFET, hetero-junction bipolar transistor (HBT), HEMT (High Electron Mobility Transistor) or the like.

The preferred embodiments of the present invention have been described but the present invention is never limited thereto and naturally allows various changes and modifications within the scope not departing from the claims thereof. For example, in the embodiments described above, the maximum number of multiplexes is set to "6", the control information indicating the number of multiplexes is formed of three bits, and the dynamic range of the amplifying circuit is changed in seven steps based on the control information of three bits. However, the present invention can also be applied when the control information indicating the number of multiplexes is formed of two bits or four or more bits. When the control information indicating the number of multiplexes is formed of four or more bits, the number of transistors which are connected with the transistor Q10 with the current-Miller connection is increased.

Moreover, even in the mobile telephone of the W-CDMA system wherein the maximum number of multiplexes is set to "6" and the control information indicating the number of multiplexes is formed of three bits, it is not always required to switch the operation current of the amplifying circuit depending on the number of multiplexes as described. The current may be switched in two stages with the procedures such that, for example, as will be understood from FIG. 14, since the peak factor increases suddenly when the number of multiplexes shifts to "3" from "2", it is also possible that the number of transistors connected to the transistor Q10 with the current-Miller connection method in the current switching circuit 138 as illustrated in FIG. 5 is set to two in place of three, the current is applied only one of the two current-Miller transistors when the number of multiplexes is "2" or less, and the operation current of the amplifying circuit is increased by applying the current to both current-Miller transistors when the number of multiplexes is set to "3" or more.

In addition, in above embodiments, the control signal MC indicating the number of multiplexes is supplied to the code division multiplex transmission circuit 130 from the baseband circuit 140. However, in the system comprising a controller such as a microprocessor for totally controlling the system in addition to the baseband circuit, it is also possible to form the structure to give the control information MC indicating the number of multiplexes to the code division multiplex transmission circuit 130 and power module 120 from the controller.

In above description, the present invention has been applied to the mobile telephone which enables communication by the W-CDMA system which is the major application field thereof and also the RF-IC as the semiconductor integrated circuit for communication to be introduced into the above mobile telephone. But the present invention is never limited thereto and can also be generally used for the mobile telephone of the communication system which realizes multiplexing by spectrum diffusion such as the dual-mode mobile telephone which enables communication with the cdma 2000 system and two systems of the W-CDMA system and PDC system for the mobile telephone.

In addition, an example for switching the operation current has been described in the embodiments described above, but it is also possible to linearly change the operation current depending on the number of multiplexes. Namely, it is enough that the operation current is changed depending on the number of multiplexes.

The effects of the typical inventions disclosed in the present invention are as follow.

Namely, in the wireless communication system which realizes multiplexing by spectrum diffusion such as the W-CDMA system, if the number of multiplexes increases, the signal can be transmitted without any distortion and current consumption when the number of multiplexes is small can also be reduced. Accordingly, when the present invention is applied to the mobile telephone which is operated with a battery, the operation life of battery, namely the maximum communication time and maximum waiting time with single charging process can be extended.

Moreover, according to the present invention, since the 1 dB compression point ICP in the variable gain amplifying portion of the transmission circuit may be improved, it is also possible to attain the semiconductor integrated circuit device for communication use ensuring excellent characteristic of leak power ratio on the adjacent channels ACPR and the wireless communication system utilizing the same device.

What is claimed is:

1. A semiconductor integrated circuit device comprising:
  a modulation circuit for modulating multiplexed signals to be transmitted; and
  a variable gain amplifying circuit for amplifying the modulated transmitting signals depending on first control information to indicate an output level,
  wherein said variable gain amplifying circuit is capable of changing the operation current depending on second control information indicating the number of multiplexes of the multiplexed signals to be transmitted and is controlled to increase said operation current when the number of multiplexes is large or to decrease said operation current when the number of multiplexes is small.

2. The semiconductor integrated circuit device according to claim 1, further comprising:
  a frequency conversion circuit for converting the signal amplified with said variable gain amplifying circuit to a signal of higher frequency; and
  a first variable gain amplifying circuit for amplifying the signal converted with the frequency conversion circuit depending on said first control information,
  wherein said first variable gain amplifying circuit is capable of switching the operation current depending on said second control information indicating the number of multiplexes and is controlled to increase said operation current when the number of multiplexes is large or to decrease said operation current when the number of multiplexes is small.

3. The semiconductor integrated circuit device according to claim 1, wherein said second control information is the signal formed of a plurality of bits, and the operation current of said variable gain amplifying circuit can be switched with the signal obtained by decoding said second control information.

4. The semiconductor integrated circuit device according to claim 3, wherein said variable gain amplifying circuit includes a pair of input differential transistors and a current transistor connected in series to said transistors, and the operation current of said variable gain amplifying circuit can be switched when the current flowing into the transistor which is connected to said current transistor with the current-Miller connection is changed depending on said second control information.

5. The semiconductor integrated circuit device according to claim 4, wherein said variable gain amplifying circuit comprises a plurality of resistance elements provided in parallel between emitter terminals of said pair of differential transistors and a plurality of switch elements for connecting and disconnecting said resistance elements, and the gain of said variable gain amplifying circuit may be changed when said switch elements are turned ON or OFF depending on said first control information to connect or disconnect said resistance elements.

6. The semiconductor integrated circuit device according to claim 4, wherein said variable gain amplifying circuit comprises a plurality of pairs of differential transistors provided in parallel to said pair of differential transistors, and the gain of said variable gain amplifying circuit may be varied when said plural pairs of differential transistors are connected or disconnected depending on said first control information.

7. An electronic component for communication comprising:
  a gain controllable power amplifying circuit for outputting the amplified transmission signal; and
  a bias circuit for giving bias to said power amplifying circuit depending on first control information indicating an output level,
  wherein said power amplifying circuit is capable of changing the operation current depending on second control information indicating a number of multiplexes of multiplexed signals to be transmitted and is controlled to increase said operation current when the number of multiplexes is large or to decrease said operation current when the number of multiplexes is small.

8. The electronic component according to claim 7, wherein said power amplifying circuit is formed of a plurality of cascade-connected amplifying stages and is capable of changing the operation current flowing into the final amplifying stage may be switched depending on said second control information.

9. The electronic component according to claim 7, wherein said power amplifying circuit includes an amplifying transistor and transistor connected to said transistor with current-Miller connection, an amplification factor of said amplifying transistor is controlled depending on the magnitude of the bias given from said bias circuit to said current-Miller transistor, a plurality of extra-amplifying transistors are provided in parallel to said amplifying transistor, and said operation current is switched depending on the condition that the current selectively flows or does not flow into these extra-amplifying transistors in accordance with said second control information.

10. The electronic component according to claim 9, wherein the switch means are respectively provided between the control terminals of said extra-amplifying transistors and the control terminals of said amplifying transistors, and said operation current is switched when these switch means are selectively set to the signal transmitting condition depending on said second control information.

11. The electronic component according to claim 7, wherein said power amplifying circuit includes an amplifying transistor and a transistor connected with said transistor by current-Miller connection, the amplification factor of said amplifying transistor is controlled depending on the magnitude of the bias given from said bias circuit to said current-Miller transistor, and said bias circuit switches the bias current flowing to said current-Miller transistor depending on said second control information.

12. A wireless communication system comprising:

a communication semiconductor integrated circuit device including: a modulation circuit for realizing modulation for multiplexed information pieces to be transmitted; and a variable gain amplifying circuit for amplifying said modulated transmission signal depending on first control information indicating an output level, wherein the variable gain amplifying circuit is capable of changing the operation current depending on the second control information indicating a number of multiplexes of the transmission signal and is controlled to increase said operation current when the number of multiplexes is large or to decrease said operation current when the number of multiplexes is small;

a baseband circuit for generating and giving the I, Q signals to be modulated by said communication semiconductor integrated circuit device; and a communication electronic component including a gain controllable power amplifying circuit for amplifying the signal outputted from said communication semiconductor integrated circuit device, and a bias circuit forgiving bias to said power amplifying circuit depending on said first control information, said first control information and said second control information being given to said communication semiconductor integrated circuit device from said baseband circuit.

13. The wireless communication system according to claim 12, wherein said power amplifying circuit is capable of changing the operation current depending on said second control information and is controlled to increase said operation current when the number of multiplexes is large or to decrease said operation current when the number of multiplexes is small, and wherein said first control information and said second control information are given to said communication semiconductor integrated circuit device and said communication electronic component from said baseband circuit.

* * * * *